United States Patent [19]

LeGrange

[11] Patent Number: 4,962,985
[45] Date of Patent: Oct. 16, 1990

[54] PROTECTIVE COATINGS FOR OPTICAL DEVICES COMPRISING LANGMUIR-BLODGETT FILMS

[75] Inventor: Jane D. LeGrange, Princeton, N.J.

[73] Assignee: AT&T Bell Laboratories, Murray Hill, N.J.

[21] Appl. No.: 415,824

[22] Filed: Oct. 2, 1989

[51] Int. Cl.$^5$ .................. G02B 6/26; B05D 5/06; C08G 69/26; B32B 27/00
[52] U.S. Cl. .................. 350/96.15; 350/96.11; 350/96.12; 350/96.34; 427/162; 372/49; 528/353; 428/473.5; 525/436
[58] Field of Search ............... 350/96.11, 96.12, 96.15, 350/96.17, 96.30, 96.34, 311; 372/49; 250/227; 528/125, 128, 172, 188, 220, 229, 352, 353; 428/473.5; 525/436; 427/162, 163

[56] References Cited

U.S. PATENT DOCUMENTS

| | | | |
|---|---|---|---|
| 4,536,450 | 8/1985 | Garito | 350/96.34 X |
| 4,659,177 | 4/1987 | Choe et al. | 350/96.34 |
| 4,696,838 | 9/1987 | Miyata et al. | 427/407.2 |
| 4,728,576 | 3/1988 | Gillberg-LaForce et al. | 350/96.34 X |
| 4,794,045 | 12/1988 | Robin et al. | 350/96.12 X |
| 4,818,616 | 4/1989 | Milverton et al. | 350/96.34 X |
| 4,822,853 | 4/1989 | Uekita et al. | 528/353 X |
| 4,830,952 | 5/1989 | Penner et al. | 430/495 X |

OTHER PUBLICATIONS

"Langmuir-Blodgett Films," by M. C. Petty, *Endeavour*, New Series, vol. 7, 1983, pp. 65-69.
"A Moisture Protection Screening Test for Hybrid Circuit Encapsulants," by R. G. Mancke, *IEEE Transactions on Components, Hybrids, and Manufacturing Technology*, vol. CHMT-4, No. 4, Dec. 1981, pp. 492-498.
"InGaAs Metal-Semiconductor Field-Effect Transistor with Langmuir-Blodgett Deposited Gate Structure," by W. K. Chan et al., *IEEE Electronic Device Letters*, vol. 9, No. 5, May 1988, pp. 220-222.
M. Kakimoto et al., "Preparation of Polyimide Mono- and Multilayer Films," Chapter 41 in Polymers for High Technology, published by American Chemical Society, 1987, pp. 484-495.
"Preliminary Information Bulletin Spin Coating Techniques," Bulletin #PC-2, published by DuPont Company, May 1985.
"Langmuir-Blodgett Films-The Ultrathin Barrier," by C. Pitt, *Electronics & Power*, Mar., 1983, pp. 226-229.

*Primary Examiner*—Brian Healy
*Attorney, Agent, or Firm*—Roderick B. Anderson

[57] ABSTRACT

A semiconductor optical device, such as a photodetector or a semiconductor laser, is sealed by a Langmuir-Blodgett film that intercepts the optical path extending from the device. The film is less than one-thirtieth of a wavelength at the operating optical frequency, which precludes interference with transmitted light waves.

6 Claims, 2 Drawing Sheets

PROTECTIVE COATINGS FOR OPTICAL DEVICES COMPRISING LANGMUIR-BLODGETT FILMS

FIELD OF THE INVENTION

This invention relates to optical communications system and, more particularly, to methods and apparatus for protectively coating optical devices of optical communications systems.

BACKGROUND OF THE INVENTION

Because of their ability to transmit larger quantities of information over a transmission line than conventional systems, optical communications systems are coming into increasingly widespread use. In its simplest form, such a system comprises an optical source such as a semiconductor laser that can be modulated with information, an optical fiber for transmitting the modulated lightwave, and a detector such as a semiconductor photodetector for converting the optical information back into electrical information.

Both semiconductor lasers and photodetectors are typically made of semiconductor material and as such are technically related to devices commonly used in the electronics industry. It is well understood that such devices must ordinarily be sealed from the environment to protect them from atmospheric contaminants, particularly water vapor. In the electronics industry, a number of encapsulants have been developed that have been found to be suitable for this purpose; for example, various silicone elastomers, and various epoxies provide good protective coatings. The semiconductor encapsulation technology cannot, however, be transferred directly to optical communications systems because of the need for the encapsulations to be transparent at the wavelengths used. For this reason, it is customary in optical communications systems to use packages for protecting semiconductor optical devices such as lasers and photodetectors, such packages each containing a glass window for permitting light to be transmitted to or from the optical device. Such packages are bulky and expensive and a great deal of effort has been directed toward reducing the bulk and expense associated with hermetic packages for semiconductor optical devices that depend upon light transmission for their function.

SUMMARY OF THE INVENTION

In accordance with the invention, the expense and bulk of sealed optical devices are greatly reduced by using Langmuir-Blodgett films to seal such devices from the environment. As will be explained in more detail below, Langmuir-Blodgett films can be deposited over optical devices such as semiconductor lasers and photodetectors to provide a dependable protective coating and yet be of such a small thickness as to be transparent to the lightwaves that are transmitted to, or received by, such devices. Specifically, such Langmuir-Blodgett films can easily be made to have a thickness of less than one-thirtieth the optical wavelength at the optical frequency operation, and so long as this small thickness is maintained, there is substantially no interference by the film of transmitted optical waves. Thus, there is no need for providing the special transparent window as in conventional packages, and the cost and bulk of the optical device package are greatly reduced.

These and other objects, features and advantages of the invention will be better understood from a consideration of the following detailed description taken in conjunction with the accompanying drawings.

DETAILED DESCRIPTION

Figure 1:
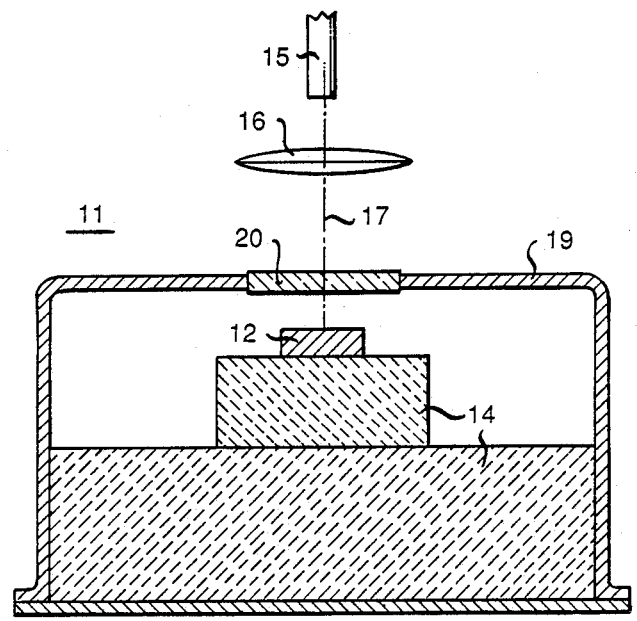
FIG. 1 is a schematic view of a photodetector packages in accordance with the prior art.

Referring now to FIG. 1, there is shown a photodetector package 11 of the prior art comprising a semiconductor photodetector 12 which is supported by a support structure 14. The photodetector 12 is part of an optical communications system and is adapted to respond to light carried by an optical fiber 15 and directed through a lens 16 along an optical path 17. Photodetector 12 is typically a semiconductor diode which responds to light intensity to generate an electrical signal that is transmitted from the diode by electrical conductors, which are not shown. More specifically, the diode converts information carried by light from fiber 15 to electrical signals. The light normally has a predominant optical frequency and the information carried by it is normally in the form of pulses or other modulation as is well known in the art. The photodetector 12 may be made of any of a number of semiconductor materials such as gallium arsenide, indium phosphide, or mercury cadmium telluride.

As is known, exposure of a semiconductor photodetector to contaminants of the atmosphere, especially water vapor, will cause the device to deteriorate over time. For this reason, it is common to include the photodetector in a sealed enclosure 19 which is typically of metal. The enclosure must include a window 20 of glass or other material that is transparent at the wavelength of light transmitted along path 17. This requires dependable glass-to-metal seals. Likewise, the support structure 14 may be made of a material such as ceramic which also requires special care in insuring a dependable seal to the metal enclosure 19. It can be appreciated that the requirements for minimal interference with the transmitted lightwave impose formidable technological requirements on the construction of the photodetector package 11 which may substantially add to the cost of the lightwave communications system of which it is a part. Further, the bulk necessitated by the hermetically sealed package may be a serious problem, for example, if the communications system is part of a data processing system which may require many photodetectors, or if the system is an extremely high speed system, in which case the bulk of the components may reduce the speed of operation capability of the system.

In accordance with the invention, the cost of, and bulk associated with, protectively sealing optical devices such as semiconductor photodetectors is significantly reduced through the use of a process described in detail in the copending patent application of Burack, et al. Ser. No. 280,074, filed Dec. 5, 1988, pending, hereby incorporated herein by reference, such process being generally known in the prior art as the Langmuir-Blodgett technique. In accordance with this technique, there is floated on a body of water, or other aqueous medium, a quantity of a substance comprising molecules which are polarized in the sense that they each have a hydrophobic end and an opposite hydrophilic end. Materials constituted of such molecules are known in the art as amphiphilic materials. The amphiphilic material so floated on the water surface is allowed to spread until it forms a layer one molecule thick ("monolayer") in which molecules of the amphiphilic material are mostly oriented in the same direction; that is, the hydrophilic or "head" end of the molecules extend toward the water and the hydrophobic or "tail" end of such molecules extend toward the air. The monolayer so formed can be transferred to a substrate by drawing the substrate from the water into the air so as to intercept the monolayer and cause its deposit on the substrate, while concurrently regulating the surface pressure of the closing monolayer. The result is a film one molecule thick known as a Langmuir-Blodgett monolayer film.

By successive transversals (which are in opposite directions) of the substrate between the water and the air, it is possible to deposit successive monolayers so as to provide on the substrate a multiplicity of monolayers constituting a laminar film. In such structure, the molecules of each monolayer are ideally all oriented to have the same pointing direction in the thickness of the monolayer. It often happens that many or most of the molecules in each monolayer on the inside of a laminar structure are coupled head-to-head and tail-to-tail with molecules in adjacent monolayers. Such coupling produces an ordering in the film of its constituent monolayers in relation to each other. While such a multilayer Langmuir-Blodgett film may, in some instances, later be modified by processing to substantially change the core character of its molecules, there is evidence that some such mutual ordering of the layers remains to some degree. In any event, a multilayer film or a monolayer film either before or after cure is still referred to as a Langmuir-Blodgett film.

Figure 2:
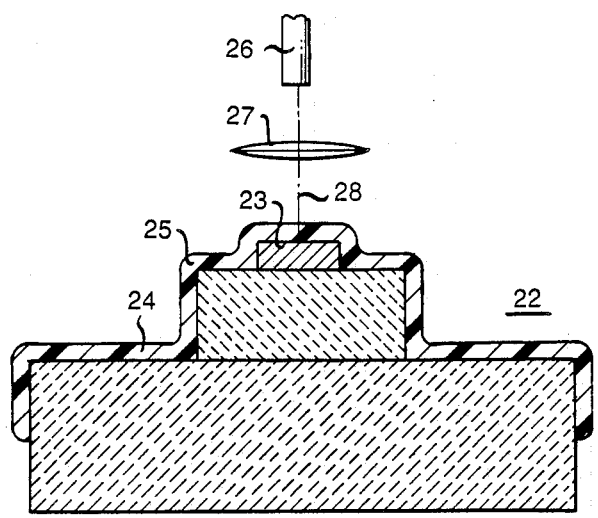
FIG. 2 is a schematic view of an improved photodetector package in accordance with the invention.

Referring to FIG. 2, a photodetector package 22 made in accordance with the invention comprises a photodetector 23 with support members 24 that may be essentially identical to the corresponding photodetector 12 and support members 14 of FIG. 1. The photodetector is, however, sealed by a Langmuir-Blodgett film 25 which may be of polyimide or other appropriate material, and which is shown in the figure with greatly exaggerated thickness. The film preferably comprises four to ten monolayers for greater structural durability than a single monolayer.

As s consequence of the improved packaging, the optic fiber 26 and associated lens 27 can be brought physically closer to the diode 23 than is true in the apparatus of FIG. 1, thus shortening the length of optical path 28 extending between the optic fiber and the photodiode 23. Each monolayer of polyimide deposited by the Langmuir-Blodgett process is initially only about forty angstrom units (0.004 microns) thick and after cure only about four angstrom units thick. It can be shown that any organic film having a thickness of less than about one-thirtieth of a wavelength of light is substantially transparent to that light, regardless of its constituency; even if such film has a much greater refractive index (e.g., 1.5) from that of air, it would impart a negligible phase shift to the light. The thinner a film is, of course, the less it will affect optical energy transmitted through it. Because of the thinness of a monolayer, five, ten or even more monolayers can be deposited with the total thickness of the laminar film still being less than one-thirtieth of a wavelength if the optical frequency has a wavelength of, say, 1.3 microns, which is a typical value for optical communications systems. Polyimide is particularly good as a protective coating for semiconductors.

Figure 3:
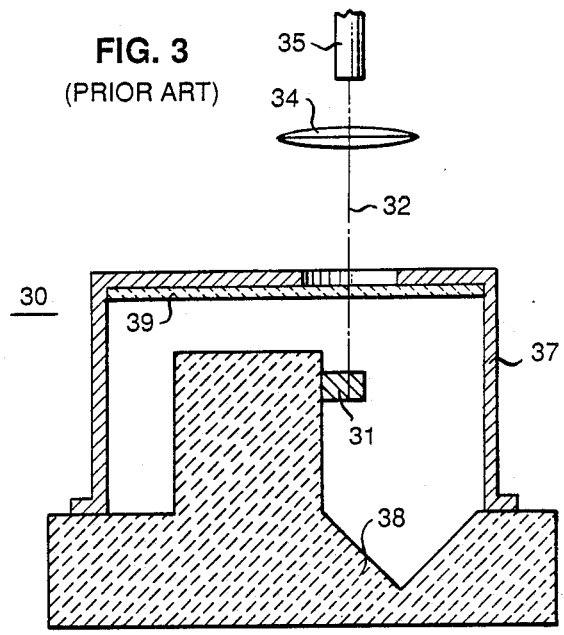
FIG. 3 is a schematic view of a semiconductor laser package in accordance with prior art.

FIG. 3 illustrates a laser package 30 of the prior art comprising a semiconductor laser 31 coupled by an optical path 32 to a lens 34 and an opticcal fiber 35. The package comprises a metal portion 37 sealed to support structure 38 and a glass window portion 39 hermetically sealed to the metal portion 37. Again, all seals must be made so as to be hermetic. FIG. 3 illustates a transparent window 39 in the hermetic enclosure made in an alternative manner to that of FIG. 1. Nevertheless, it can be appreciated that this laser package is inherently bulky and costly.

Figure 4:
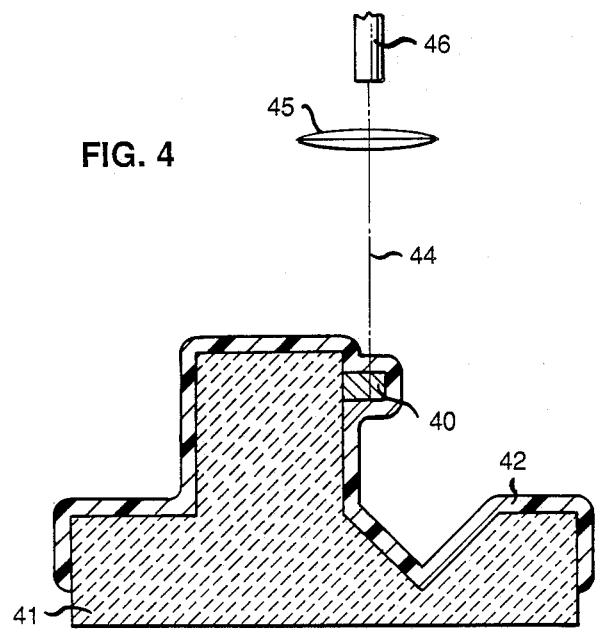
FIG. 4 is a schematic view of a semiconductor laser package in accordance with the invention.

In accordance with another embodiment of the invention, FIG. 4 illustrates a semiconductor laser 40 supported by a support structure 41 which is encapsulated by a Langmuir-Blodgett film 42 which preferably comprises several monolayers of polyimide, such as eight monolayers. The laser 40 is coupled along an optical path 44 to a lens 45 and an optical fiber 46. The Langmuir-Blodgett film 42 is made, as before, by repeatedly dipping it in a tank containing a surface film of amphiphilic material such as a polyimide precursor. It can be shown that the cost of making a film in this manner is much lower than that of the hermetic package of FIG. 3 and reduction in bulk is clear from a comparison of FIG. 4 with FIG. 3. The laser 40 may be made of any of a number of semiconductor materials such as gallium arsenide, aluminum gallium arsenide, or indium phosphide. Any of these and other known semiconductor materials are subject to deterioration if exposed to atmospheric conditions over a prolonged time period and thus the sealed package or, in accordance with the invention, the Langmuir-Blodgett film, is required for its continued operation. The laser may emit light of 1.6 microns wavelength that is transmitted through film 42, over path 44, through lens 45 to optical fiber 46. In tests made on indium phosphide lasers it was found that, with fifty monolayers of the Langmuir-Blodgett film, the laser worked, but the threshold current of operation was higher than was acceptable. With five monolayers, the laser worked as intended.

In the embodiments of both FIG. 2 and FIG. 4, the Langmuir-Blodgett film may be constituted of a polyimide material commercially available from the Du Pont Company of Wilmington, Delaware and identified as PI-2545, one indentified as PI-2555, or one identified as PI-2566. An advantage in the use of PI-2566 is that it is a fluorinated polyimide material of low wettability. Preferably several monolayers of the film are formed for maximizing protection without interfering with optical transmission, that is, without having thicknesses large compared to a wavelength of the transmitted light. Polymide and other known Langmuir-Blodgett materials, when processed by conventional techniques (e.g., spin or spray coating), form films of thicknesses on the order of or larger than the wavelength of light used in optical communication, thereby interfering with such light. Efforts to make films thinner result in films that are discontinuous or otherwise unsuitable for protection purposes.

An outline of an illustrative method for coating optical devices with polyimide Langmuir-Blodgett (L-B) film is as follows:

I. Preparation of Amphiphilic Material

1. Most polyimides are deposited as polyamic acid, then imidized by heat or chemicals.
2. A polyamic acid alone cannot be deposited as an L-B film. A polyamic acid aldylamine salt is used.
3. The polyamic acid used for these methods is the Du Pont Pyralin ® 2555 material.
4. Prepartation of polyamic acid alkylamine salt from the Du Pont materials.
   a. The polyamic acid is sold by Du Pont already in a solution of N-Methyl-2-Pyrrolidone. The material is further diluted in a solution of 1:1 benzene/dimethylacetamide, to a concentration of 1 mmolar of polyamic acid (PAA).
   b. A 1 mmolar solution of N,N-dimethylhexadecylamine (DMHDAm) in 1:1 benzene/N,N-dimethylacetamide is prepared separately.
   c. The two solutions are then mixed together in a ratio of one part PAA to two parts DMHDAm to form a 0.33 mmolar solution of polyamic acid alkylamine salt. The material is now ready for deposition as an L-B film by floating the material on water in a Langmuir-Blodgett trough and then transferring the resulting L-B film to a substate as described above.

II. Forming the L-B Film

1. General Parameters
   a. Deposition Parameters
      (1) Deposition Surface Pressure-25 dynes/cm.
      (2) Substrate Dipping Speed-4 mm/minute.
2. Parameters for Curing L-B Films Deposited on substrate
   (1) Thermal
      (a) 5° C./minute ramp from ambient to 175° C.
      (b) A one hour dwell at 175° C.
      (c) 5° C./minute ramp to 350° C.
      (d) Two hour dwell at 350° C.
      (e) All steps are performed under nitrogen purge.

The foregoing has illustrated how the invention may be used to reduce significantly the size and cost of components of an optical communications system. Such systems should be considered as being any system which transmits information in the form of lightwaves and may include data processing systems as well as telephone systems. Various modifications and embodiments other than those explicitly described may be made by those skilled in the art without departing from the spirit and scope of the invention.

What is claimed is:

1. An optical communication system comprising:
   a first optical device adapted to be optically coupled to a second optical device by light of a predetermined optical frequency transmitted along an optical path extending between the first and second optical devices;
   said first optical device being of a type that is susceptible to deterioration if exposed over a period of time to atmospheric contaminants;
   means comprising a Langmuir-Blodgett film covering at least part of the first optical device for sealing said first optical device, thereby preventing water vapor molecules and other atmospheric contaminants from contacting the first optical device;
   said Langmuir-Blodgett film extending across said optical path;
   said Langmuir-Blodgett film having a thickness of less than one-thirtieth the wavelength of said light at said optical frequency.

2. The optical communication system of claim 1 wherein: said first optical device is a semiconductor photodetector.

3. The optical communication system of claim 1 wherein: said first optical device is a semiconductor laser.

4. The optical communication system of claim 1 wherein: said Langmuir-Blodgett film consists of a polyimide composition.

5. The optical communication system of claim 4 wherein: said first optical device is a semiconductor photodetector.

6. The optical communication system of claim 4 wherein: said first optical device is a semiconductor laser.

* * * * *